United States Patent
Lo et al.

(10) Patent No.: US 7,880,213 B2
(45) Date of Patent: Feb. 1, 2011

(54) BOTTOM ELECTRODE OF METAL-INSULATOR-METAL CAPACITOR

(75) Inventors: Wen-Miao Lo, Kaohsiung (TW); Lurng-Sheng Lee, Hsinchu County (TW); Pei-Ren Jeng, Hsinchu (TW); Cha-Hsin Lin, Tainan (TW); Ching-Chiun Wang, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 122 days.

(21) Appl. No.: 11/308,841

(22) Filed: May 15, 2006

(65) Prior Publication Data

US 2007/0166911 A1    Jul. 19, 2007

(30) Foreign Application Priority Data

Dec. 29, 2005   (TW) .............................. 94147153 A

(51) Int. Cl.
*H01L 27/108*   (2006.01)

(52) U.S. Cl. ................. 257/309; 257/303; 257/306; 257/E27.086; 438/238; 438/239; 438/253

(58) Field of Classification Search ................. 257/306, 257/E27.086, 309, 303; 438/238, 239, 253
See application file for complete search history.

(56) References Cited

U.S. PATENT DOCUMENTS

| 6,159,793 A | 12/2000 | Lou | 438/255 |
| 6,812,112 B2 | 11/2004 | Basceri et al. | 438/398 |
| 6,833,576 B2 * | 12/2004 | Agarwal et al. | 257/300 |

* cited by examiner

*Primary Examiner*—Matthew E Warren
*Assistant Examiner*—John Lin
(74) *Attorney, Agent, or Firm*—Jianq Chyun IP Office

(57) ABSTRACT

A structure and a method of fabricating a bottom electrode of a metal-insulator-metal (MIM) capacitor are provided. First, a transition metal layer is formed on a substrate. Thereafter, a self-assembling polymer film having a nano-pattern is formed on the transition metal layer to expose a portion of the transition metal layer. Using the self-assembling polymer film as a mask, the exposed portion of the transition metal layer is treated to undergo a phase change so that the bottom electrode can achieve a nano-level of phase separation. Thereafter, the self-assembling polymer film is removed.

6 Claims, 3 Drawing Sheets

US 7,880,213 B2

BOTTOM ELECTRODE OF METAL-INSULATOR-METAL CAPACITOR

CROSS-REFERENCE TO RELATED APPLICATION

This application claims the priority benefit of Taiwan application serial no. 94147153, filed on Dec. 29, 2005. All disclosure of the Taiwan application is incorporated herein by reference.

BACKGROUND OF THE INVENTION

1. Field of the Invention

The present invention relates to a metal-insulator-metal (MIM) capacitor and a method of fabricating the same. More particularly, the present invention relates to a bottom electrode of a metal-insulator-metal (MIM) capacitor and a method of fabricating the same.

2. Description of Related Art

Semiconductor memory mainly comprises a transistor and a capacitor. With the approach of a high aspect ratio process for the semiconductor memory, the lateral area of the capacitor in the device must be reduced. As the demand for higher memory storage capacity by the computer software grows rapidly, the required capacitance is increased correspondingly. Therefore, in order to meet this demand, some modification must be made to the semiconductor process.

At present, in a method directed to increase capacitance and reduction in space occupation, a high-k material is used as an insulating layer to fabricate the MIM capacitor in order to achieve an adequate capacitance value and also reduce the space occupation of the capacitor. Furthermore, by increasing the bottom electrode surface area of the MIM capacitor, a higher capacitance value can be achieved.

SUMMARY OF THE INVENTION

Accordingly, an object of the present invention is to provide a bottom electrode of the MIM capacitor, wherein the contact area of the bottom electrode is increased through a phase change of the material of the bottom electrode.

Another object of the present invention is to provide a method of manufacturing the MIM capacitor, such that the bottom electrode having a nano-pattern is fabricated by a simple process.

Still another object of the present invention is to provide a MIM capacitor comprising a bottom electrode having comparatively a larger contact area.

The bottom electrode of the MIM capacitor of the present invention comprises a transition metal layer. The transition metal layer comprises a nano-pattern area and a phase change area, wherein the height of the nano-pattern area is lower than that of the phase change area.

According to an embodiment of the present invention, the phase change area of the transition metal layer comprises a nitridation area, an oxidation area, or a hydrogenation area of the transition metal layer.

According to an embodiment of the present invention, a material of the transition metal layer comprises Pt, Ru, Ir or Ti.

The present invention further provides a method of fabricating the bottom electrode of the MIM capacitor. First, a transition metal layer is formed on a substrate. Thereafter, a self-assembling polymer film having a nano-pattern is formed on the transition metal layer to expose a portion of the transition metal layer. Afterwards, by utilizing the self-assembling polymer film as a mask, the exposed portion of the transition metal layer is treated to undergo a phase change. Thereafter, the self-assembling polymer film is removed.

According to an embodiment of the present invention, the step of treating the exposed portion of the transition metal layer to undergo a phase change comprises placing the transition metal layer in a gas atmosphere, such that the gas enters the surface of the exposed transition metal layer in the atom state. The gas includes $O_2$, $N_2$, $H_2$, or $NH_3$.

According to an embodiment of the present invention, the step of forming the transition metal layer on a substrate includes performing a chemical vapor deposition (CVD), physical vapor deposition (PVD), or atomic layer deposition (ALD).

According to an embodiment of the present invention, a material of the transition metal layer comprises Pt, Ru, Ir or Ti.

According to an embodiment of the present invention, the transition metal layer may be etched to further increase the surface height difference of the transition metal layer after the self-assembling polymer film is removed.

According to an embodiment of the present invention, the self-assembling polymer film comprises polystyrene (PS) or polymethylmethylsiloxane (PMMS).

The present invention provides a structure of a MIM capacitor comprising a conductive layer, a transition metal layer and a capacitor dielectric layer. The conductive layer serves as an upper electrode of the capacitor and the transition metal layer under the conductive layer serves as a bottom electrode of the capacitor. The transition metal layer includes a nano-pattern area and a phase change area, wherein the nano-pattern area is lower than the phase change area. Furthermore, the capacitor dielectric layer is located between the conductive layer and the transition metal layer.

According to an embodiment of the present invention, the phase change area of the transition metal layer comprises a nitridation area, an oxidation area or a hydrogenation area of the transition metal layer.

According to an embodiment of the present invention, a material of the transition metal layer comprises Pt, Ru, Ir or Ti.

Since the present invention utilizes the volume difference of different phases of the transition metal layer to increase the contact surface area of the capacitor, the contact surface area of the bottom electrode can be increased under the circumstance that the two-dimensional area of the device is not increased, thereby achieving the largest capacitance within the same area, and thus increase in the fabrication cost may be avoided.

In order to the make aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

DESCRIPTION OF EMBODIMENTS

Figure 1A:
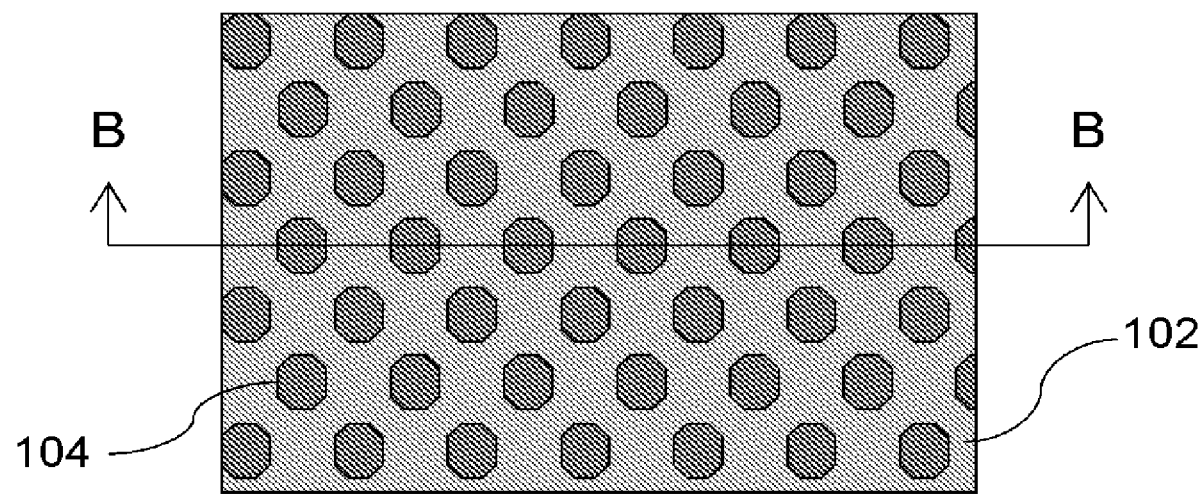
FIG. 1A is a top view of a bottom electrode of a MIM capacitor according to a preferred embodiment of the present invention.
Figure 1B:
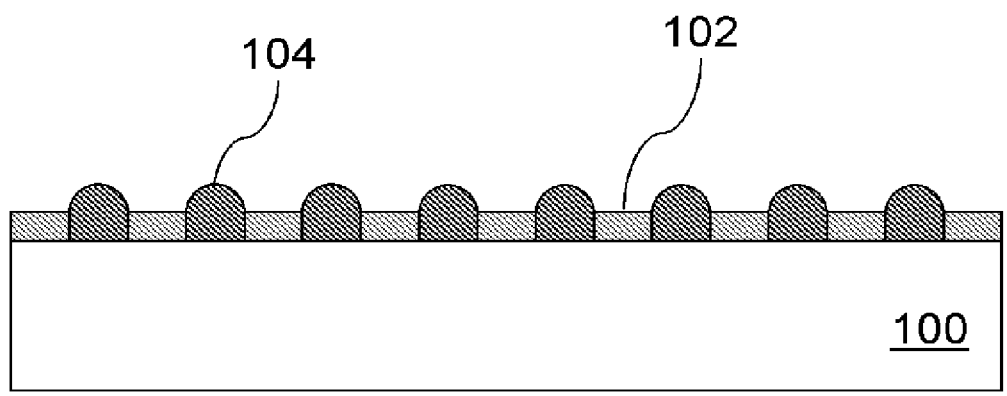
FIG. 1B is a sectional view along the Line B-B in FIG. 1A.

FIG. 1A is a top view of a bottom electrode of a MIM capacitor according to a preferred embodiment of the present invention, and FIG. 1B is a sectional view along the Line B-B in FIG. 1A.

Referring to FIGS. 1A and 1B, the bottom electrode of the MIM capacitor according to an embodiment of the present invention comprises a transition metal layer formed on a substrate 100. The transition metal layer comprises a nano-pattern area 102 and a phase change area 104, wherein the height of the nano-pattern area 102 is lower than that of the phase change area 104. Furthermore, the phase change area 104 of the transition metal layer comprises, for example, a nitridation area, an oxidation area, or a hydrogenation area of the transition metal layer. A material of the transition metal layer may comprise Pt, Ru, Ir, or Ti.

FIGS. 2A-2D are sectional views of the process steps for fabricating the MIM capacitor according to an embodiment of the present invention.

Figure 2A:
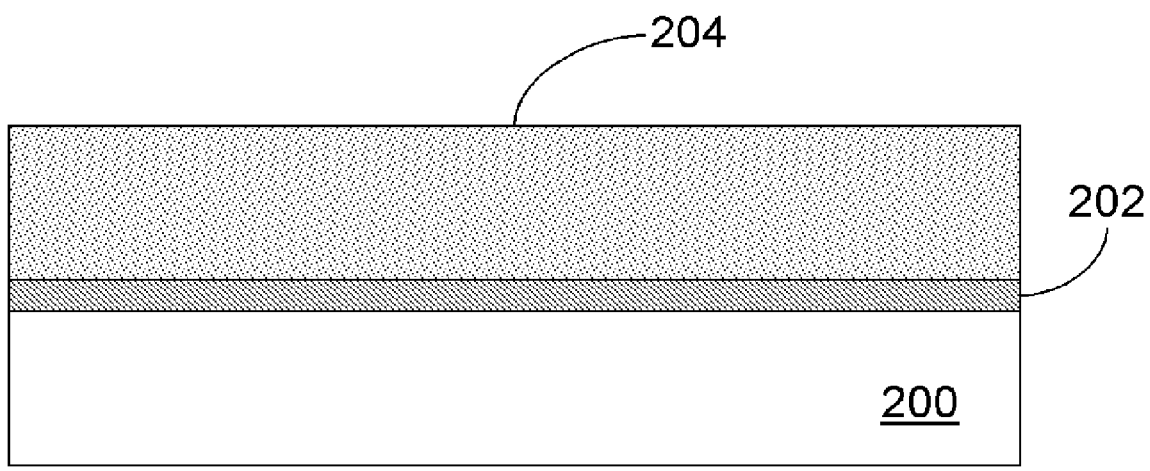
FIGS. 2A-2D are sectional views of the process steps for fabricating the MIM capacitor according to another preferred embodiment of the present invention.

Referring to FIG. 2A, first, a transition metal layer 202 is formed on a substrate 200, and a material of the transition metal layer 202 comprises, for example, Pt, Ru, Ir, or Ti. The transition metal layer 202 may be formed by methods including, for example, chemical vapor deposition (CVD), physical vapor deposition (PVD), or atomic layer deposition (ALD). Generally, with the atomic layer deposition (ALD), a preferred cladding and uniformity can be achieved. Thereafter, a self-assembling polymer film 204 is coated on the transition metal layer 202. At this time, the self-assembling polymer film 204 is in a unstable state, wherein the material of the self-assembling polymer film 204 is a polymer material, for example, polystyrene (PS), polymethylmethylsiloxane (PMMS), or the like.

Figure 2B:
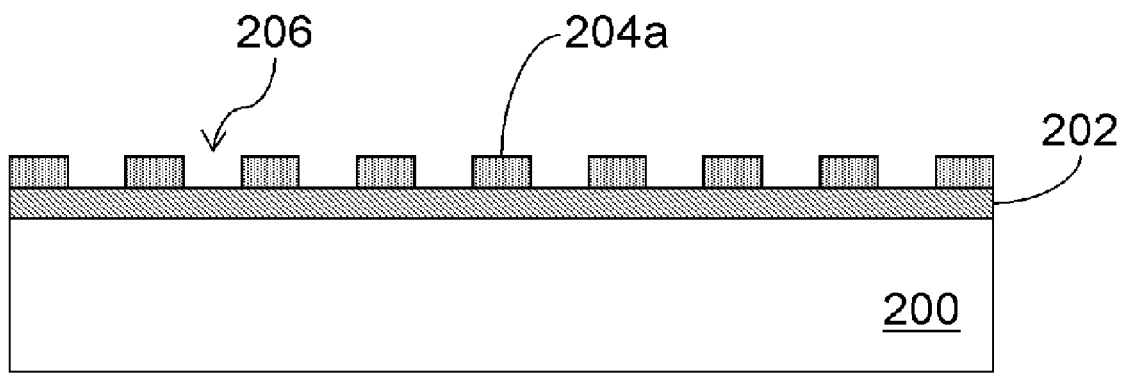

Next, referring to FIG. 2B, the unstable self-assembling polymer film 204 is exposed to heat or irradiation in order to transform into a stable self-assembling polymer film 204a. The self-assembling polymer film 204a comprises a nano-pattern and exposes a portion 206 of the transition metal layer 206. Additionally, the desired pattern may be achieved through modulation of the density and thickness of the original self-assembling polymer film 204, as shown in FIG. 2A.

Figure 2C:
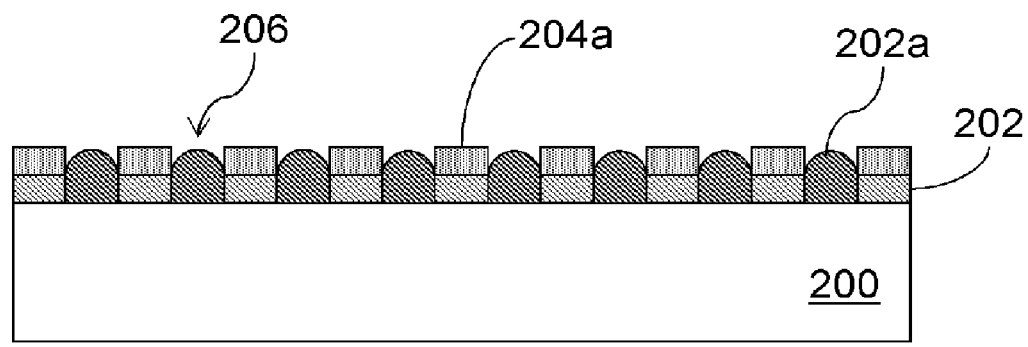

Thereafter, referring to FIG. 2C, with the self-assembling polymer film 204a as a mask, the exposed portion 206 of the transition metal layer 202 is exposed to a gas atmosphere to undergo a phase change to form phase change areas 202a, wherein the gas enters the surface of the transition metal layer 202 in the atom state, and thereby change the lattice structure, and thus a partial volume of the metal expands. The gas includes, for example, $O_2$, $N_2$, $H_2$, or $NH_3$. Thereafter, the surface height difference of the transition metal layer 202 is increased by using the etching selectivity ratio difference of different phases such that the surface roughness of the bottom electrode may be controlled. For example, when the material of the transition metal layer 202 is Ru and the material of the phase change area 202a is $RuO_2$, an etching solution containing $NH_4OH$ or a mixture of $CH_3COOH$ and $NH_4OH$ may be used to etch the whole transition metal layer 202 to increase the surface height difference.

Figure 2D:
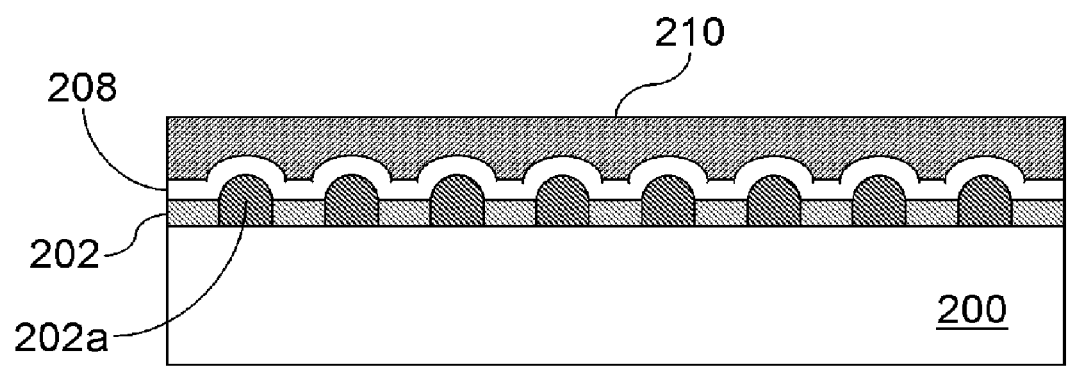

Next, referring to FIG. 2D, the self-assembling polymer film 204a is removed (as shown in FIG. 2C), and the transition metal layer 202 and the phase change area 202a of the separation phase remain. Next, a dielectric layer 208 is formed on the substrate 200 to cover the bottom electrode comprised of the transition metal layer 202 and the phase change area 202a. The dielectric layer 208 comprises a high-k constant, for example, $HfO_2$, $Al_2O_3$, $Ta_2O_5$, $BaTiO_3$, or the like. Thereafter, an upper electrode layer 210 is formed on the dielectric layer 208 to complete the fabrication of the MIM capacitor.

In view of the above, the bottom electrode comprising the transition metal layer may achieve a nano-level phase separation by using the nano-pattern of the self-assembling polymer film, such that the desired capacitor characteristics can be controlled more easily.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bottom electrode of a metal-insulator-metal (MIM) capacitor, comprising:
    a solid nano-pattern area on a substrate, having a thickness and a bottom, wherein a material of the solid nano-pattern area is a transition metal; and
    a plurality of phase change areas on the substrate, dispersed in the solid nano-pattern area, wherein the thickness of the solid nano-pattern area is lower than that of the plurality of phase change areas, the bottom of the solid nano-pattern area and a bottom of the plurality of phase change areas are on the same level, and the plurality of phase change areas is made of a material phase-changed from the transition metal,
    wherein the solid nano-pattern area covers a portion of the substrate, and the phase change areas cover the substrate not covered by the solid nano-pattern area.

2. The bottom electrode of a MIM capacitor as claimed in claim 1, wherein the plurality of phase change areas is made of a transition metal nitride, a transition metal oxide, or a transition metal hydride.

3. The bottom electrode of a MIM capacitor as claimed in claim 1, wherein the transition metal comprises Pt, Ru, Ir or Ti.

4. A metal-insulator-metal (MIM) capacitor, comprising:
    a conductive layer, serving as an upper electrode of a capacitor;
    a bottom electrode of the capacitor, located under the conductive layer, wherein the bottom electrode includes:
        a solid nano-pattern area on a substrate, having a thickness and a bottom, wherein a material of the solid nano-pattern area is a transition metal; and
        a plurality of phase change areas on the substrate, dispersed in the solid nano-pattern area, wherein the thickness of the solid nano-pattern area is lower than that of the plurality of phase change areas, the bottom of the solid nano-pattern area and a bottom of the plurality of phase change areas are on the same level, and the plurality of phase change areas is made of a material phase-changed from the transition metal; and
    a capacitor dielectric layer, located between the conductive layer and the bottom electrode, wherein the capacitor dielectric layer contacts with the plurality of phase change areas and the solid nano-pattern area,
    wherein the solid nano-pattern area covers a portion of the substrate, and the phase change areas cover the substrate not covered by the solid nano-pattern area.

5. The MIM capacitor as claimed in claim 4, wherein the plurality of phase change areas is made of a transition metal nitride, a transition metal oxide, or a transition metal hydride.

6. The MIM capacitor as claimed in claim 4, wherein the transition metal comprises Pt, Ru, Ir or Ti.

* * * * *